(12) United States Patent
De Burgh

(10) Patent No.: US 10,530,319 B2
(45) Date of Patent: Jan. 7, 2020

(54) VOLUME-LEVELLING PROCESSING

(71) Applicant: DOLBY LABORATORIES LICENSING CORPORATION, San Francisco, CA (US)

(72) Inventor: Mark David De Burgh, Mount Colah (AU)

(73) Assignee: Dolby Laboratories Licensing Corporation, San Francisco, CA (US)

(*) Notice: Subject to any disclaimer, the term of this patent is extended or adjusted under 35 U.S.C. 154(b) by 0 days.

(21) Appl. No.: 15/751,828

(22) PCT Filed: Aug. 17, 2016

(86) PCT No.: PCT/US2016/047307
§ 371 (c)(1),
(2) Date: Feb. 9, 2018

(87) PCT Pub. No.: WO2017/034874
PCT Pub. Date: Mar. 2, 2017

(65) Prior Publication Data
US 2018/0234069 A1 Aug. 16, 2018

Related U.S. Application Data

(60) Provisional application No. 62/208,911, filed on Aug. 24, 2015.

(30) Foreign Application Priority Data

Sep. 25, 2015 (EP) .................................... 15186892

(51) Int. Cl.
H03G 5/16 (2006.01)
H03G 5/00 (2006.01)
H03G 9/00 (2006.01)

(52) U.S. Cl.
CPC ............. *H03G 5/165* (2013.01); *H03G 5/005* (2013.01); *H03G 9/005* (2013.01)

(58) Field of Classification Search
CPC .......... H03G 5/165; H03G 5/005; H03G 5/16; H03G 5/18; H03G 9/005; H03G 9/025;
(Continued)

(56) References Cited

U.S. PATENT DOCUMENTS 5,570,424 A * 10/1996 Araya .................. G10H 1/0091
381/61
6,031,916 A * 2/2000 Saito ...................... G10H 7/004
381/61
(Continued)

FOREIGN PATENT DOCUMENTS

GB 2510323 8/2014
WO 1999/021185 4/1999
(Continued)

OTHER PUBLICATIONS

Jochelson, D. et al "Design of a Flexible Crossfade/Level Controller Algorithm for Portable Media Platforms" AES Convention: Oct. 2007.
(Continued)

*Primary Examiner* — Davetta W Goins
*Assistant Examiner* — Daniel R Sellers

(57) ABSTRACT

A method in a computing device configured to perform volume-levelling processing on input audio data by at least applying one or more filters to the input audio data, the computing device being configured to obtain an estimated difference between a target output loudness level and a loudness level associated with the input audio data, and to adapt the filter coefficients of the one or more filters based on the estimated difference. The method involves starting, or stopping, the volume-levelling processing. The method
(Continued)

comprises gradually increasing, or decreasing, a weighting applied to the estimated difference, in response to obtaining an indication to start, or stop, the volume-levelling processing.

20 Claims, 7 Drawing Sheets

(58) Field of Classification Search
CPC .......... H03G 9/14; H03G 9/18; H03G 3/3005; H03G 3/301; H03G 2201/506; H03G 2201/60; H03G 2201/603; H03G 2201/606
USPC .......................................................... 381/103
See application file for complete search history.

(56) References Cited

U.S. PATENT DOCUMENTS

| | | | |
|---|---|---|---|
| 6,421,697 | B1 | 7/2002 | McGrath |
| 7,095,860 | B1* | 8/2006 | Kemp ...................... G10H 1/46 |
| | | | 381/102 |
| 8,160,280 | B2 | 4/2012 | Strauss |
| 2010/0272290 | A1 | 10/2010 | Carroll |
| 2013/0279708 | A1 | 10/2013 | Seefeldt |
| 2014/0140537 | A1* | 5/2014 | Soulodre ................ H03G 5/005 |
| | | | 381/104 |
| 2014/0321670 | A1 | 10/2014 | Nystrom et al. |
| 2015/0125001 | A1* | 5/2015 | Shimizu ................... H04R 3/00 |
| | | | 381/104 |

FOREIGN PATENT DOCUMENTS

| | | |
|---|---|---|
| WO | 2005/050651 | 6/2005 |
| WO | 2007/120453 | 10/2007 |
| WO | 2013/075138 | 5/2013 |
| WO | 2013/158804 | 10/2013 |

OTHER PUBLICATIONS

Advanced Television Systems Committe, Inc. "Digital Audio Compression Standard (AC-3, E-AC-3)" Revision B, Document A/52B, Jun. 14, 2005.
ISO/IEC 13818-7, "Advanced Audio Coding (AAC) as MPEG-2 AAC Standard".
ISO/IEC 14496-3, subpart 4 "MPEG-4 Audio Standard".
ITU-R BS.1770-3 "Algorithms to Measure Audio Programme Loudness and True-Peak Audio Level" Aug. 2012.

* cited by examiner

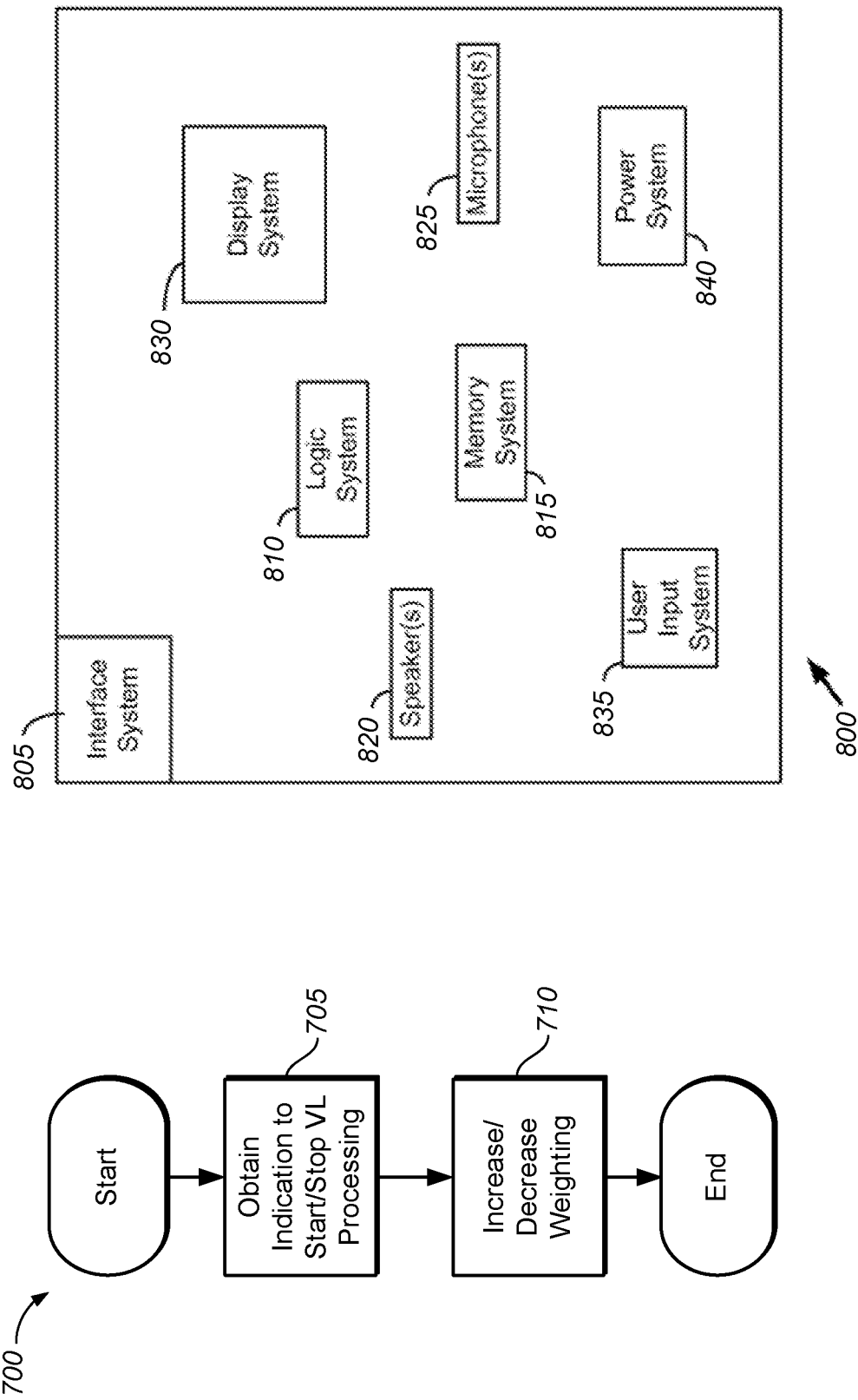

VOLUME-LEVELLING PROCESSING

CROSS-REFERENCE TO RELATED APPLICATIONS

This application claims priority to U.S. Provisional Patent Application No. 62/208,911, filed Aug. 24, 2015 and European Patent Application No. 15186892.4, filed Sep. 25, 2015, each of which is hereby incorporated by reference in its entirety.

TECHNICAL FIELD

The present disclosure relates to processing audio data. More specifically, embodiments described herein relate to Volume-Levelling (VL) processing of audio data.

BACKGROUND

VL processing is performed on audio data in order to remove or at least reduce inconsistencies in loudness levels when the audio data is rendered. Loudness may be measured in units of phon. The loudness of a given sound in phon is the sound pressure level (SPL) of a 1 kHz tone having a subjective loudness equal to that of the sound. Loudness may also be measured in units of "sone". There is a one-to-one mapping between phon units and sone units. One sone is defined as the loudness of a 40 dB (SPL) 1 kHz pure sine wave and is equivalent to 40 phon. The units of sone are such that a twofold increase in sone corresponds to a doubling of perceived loudness. For example, 4 sone is perceived as twice as loud as 2 sone.

Inconsistencies in loudness levels may be experienced when, for example, switching between television channels. This may be appreciated from FIG. 1, which shows respective audio waveforms before (top) and after (bottom) VL processing during switching between two television channels; what is shown is that after VL processing the loudness of Television Channel 1 is a little lower and the loudness of Television Channel 2 is considerably higher. Such inconsistencies may also be experienced within a single audio program. This may be appreciated from FIG. 2, which shows respective audio waveforms before (top) and after (bottom) VL processing for two different audio objects in a movie's audio program, namely dialogue and a sound effect of wind blowing in the background; what is shown is that after VL processing the loudness of the dialogue audio object is reduced without noticeably reducing the loudness of the sound effect audio object.

State-of-the-art VL processing technologies, such as Dolby® Volume, tend to employ a psychoacoustic model of human hearing to reduce the difference between a reference loudness level and the estimated loudness level that a listener would hear without the VL processing. That is, such technologies apply different gains to different parts of the audible frequency spectrum, to maintain consistent timbre as the loudness is changed. This may be appreciated from FIG. 3, which schematically shows four different plots of sound pressure level (in dB) versus frequency (in Hz) in the human-audible frequency range, before (left-hand side) and after (right hand side) VL processing; as can be seen, the amount of (negative) gain applied to the input audio signal is frequency dependent, with the aim of keeping all frequency components above the threshold of hearing while maintaining so far as possible the characteristics originally intended by the audio content producers and/or mixers.

State-of-the-art VL processing technologies tend to use at least one filter to apply frequency-dependent gain. The coefficients of the filter(s) are changed in real time in dependence on the audio data to be processed, typically on a frame-by-frame basis. A typical arrangement for changing the filter coefficients, as shown in FIG. 4 of the accompanying drawings, is to run two filters in parallel, on the same audio data, alternately changing the filter coefficients of one or other of the two filters, and then cross-fading between the respective outputs of the two filters over the course of a frame (of the audio data). Any suitable cross-fading profile can be chosen; in the arrangement shown in FIG. 4, the cross fading profile is linear.

It will be appreciated that running two filters in parallel, e.g. as shown in FIG. 4, results in a not-insignificant computational overhead, in terms of both processing cycles and memory usage. In order to avoid this overhead when possible, in some state-of-the-art VL processing technologies, the arrangement shown in FIG. 4 is disabled for audio data that is deemed not to require VL processing, and a simple gain is applied instead.

SUMMARY

The applicant has recognized that disabling the arrangement shown in FIG. 4 and switching instead to a simple gain, even via a simple cross fade, from one frame of audio data to the next, can in some circumstances introduce audible artefacts, for example a shift in timbre.

To address this issue, one aspect of the present disclosure provides a method in a computing device configured to perform volume-levelling processing on input audio data. The computing device applies one or more filters to the input audio data and obtains an estimated difference between a target output loudness level and a loudness level associated with the input audio data. The computing device adapts the filter coefficients of the one or more filters based on the estimated difference. The method is concerned with starting, or stopping, the volume-levelling processing. The method comprises gradually increasing, or decreasing, a weighting applied to the estimated difference, in response to obtaining an indication to start, or stop, the volume-levelling processing.

That is, the method involves smoothly phasing-in, or phasing-out, the volume-levelling processing. Rather than starting/stopping volume-levelling processing straightaway, and then phasing-in/-out its output, the method involves phasing-in/-out the extent to which the volume-levelling processing tries to reduce the difference between the target output loudness level and the loudness level associated with the input audio data. This is done efficiently by gradually increasing/decreasing a weighting applied to an existing signal. It may be considered counterintuitive, since it entails a lesser reduction of the difference between the target output loudness level and the loudness level associated with the input audio data. However, the applicant has recognized that, provided that the gradual increase/decrease is not too slow, the lesser reduction tends not to be perceptible because inter alia there tends to be cross fade from a part of the audio data that requires VL processing to a part of the audio data that does not require VL processing, and vice versa.

The method may comprise increasing from a lower limit to an upper limit, or decreasing from the upper limit to the lower limit, the weighting applied to the estimated difference over the course of a first predetermined time period.

Typically, the first predetermined time period is not more than 500 milliseconds, in order that said gradual increase/ decrease is not too slow. Preferably, the first predetermined time period is not less than 50 milliseconds, in order that said gradual increase/decrease is not too fast to significantly reduce the problem artefacts. More preferably, the first predetermined time period is not less than 150 milliseconds and not more than 250 milliseconds.

Typically, but not necessarily, the lower limit is a multiplicative factor of 0.5 or less. Preferably, the lower limit is a multiplicative factor of 0.25 or less. More preferably, the lower limit is a multiplicative factor of 0. Typically, but not necessarily, the upper limit is a multiplicative factor greater than 0.5. Preferably, the upper limit is a multiplicative factor of 0.75 or greater. More preferably the upper limit is a multiplicative factor of 1.

The method may comprise cross-fading from an audio data output of the one or more filters to an audio data output of a module configured to apply a substantially frequency-independent gain to the input audio data, or vice versa. Typically, the cross-fading begins during a second predetermined time period centered on expiry, or commencement, of the first predetermined time period. Preferably, the second predetermined time period is not more than 50 milliseconds.

In some embodiments, the one or more filters comprises two filters applied to the input audio data at the same time. In such embodiments, updating the filter coefficients of the one or more filters may comprise alternately updating respective sets of filter coefficients of the two filters. In such embodiments, the method may comprise alternately cross-fading between the respective audio data outputs of the two filters. Where the audio data is made up of a sequence of frames, the respective sets of filter coefficients may be alternately updated on a per-frame basis; for example, during a given frame of the audio data, only a first one of the filters has its coefficients updated, and then during the directly following frame of the audio data, only the other one of the filters has its coefficients updated.

In some embodiments, the computing device is configured such that adapting the filter coefficients of the one or more filters also takes account of a frequency-independent level shift input. In such embodiments, the method may further comprise applying a weighting to the frequency-independent level shift input which is matched to the weighting applied to the estimated difference.

The present disclosure also provides a computing device configured to perform volume-levelling processing on input audio data. The volume-levelling processing comprises applying one or more filters to the input audio data. The computing device is configured to obtain an estimated difference between a target output loudness level and a loudness level associated with the input audio data, and to adapt the filter coefficients of the one or more filters based on the estimated difference. The computing device is further configured to perform the method described above.

The present disclosure also provides a non-transitory medium comprising software which, when executed by a logic system of a computing device, causes the computing device to perform the method described above.

BRIEF DESCRIPTION OF THE DRAWINGS

FIG. 9 schematically shows the main steps of a method performed by the novel arrangement shown in FIG. 6.

FIG. 10 is a block diagram showing examples of components of an audio processing apparatus in accordance with various embodiments of the present disclosure.

DESCRIPTION OF EMBODIMENTS

Figure 5:
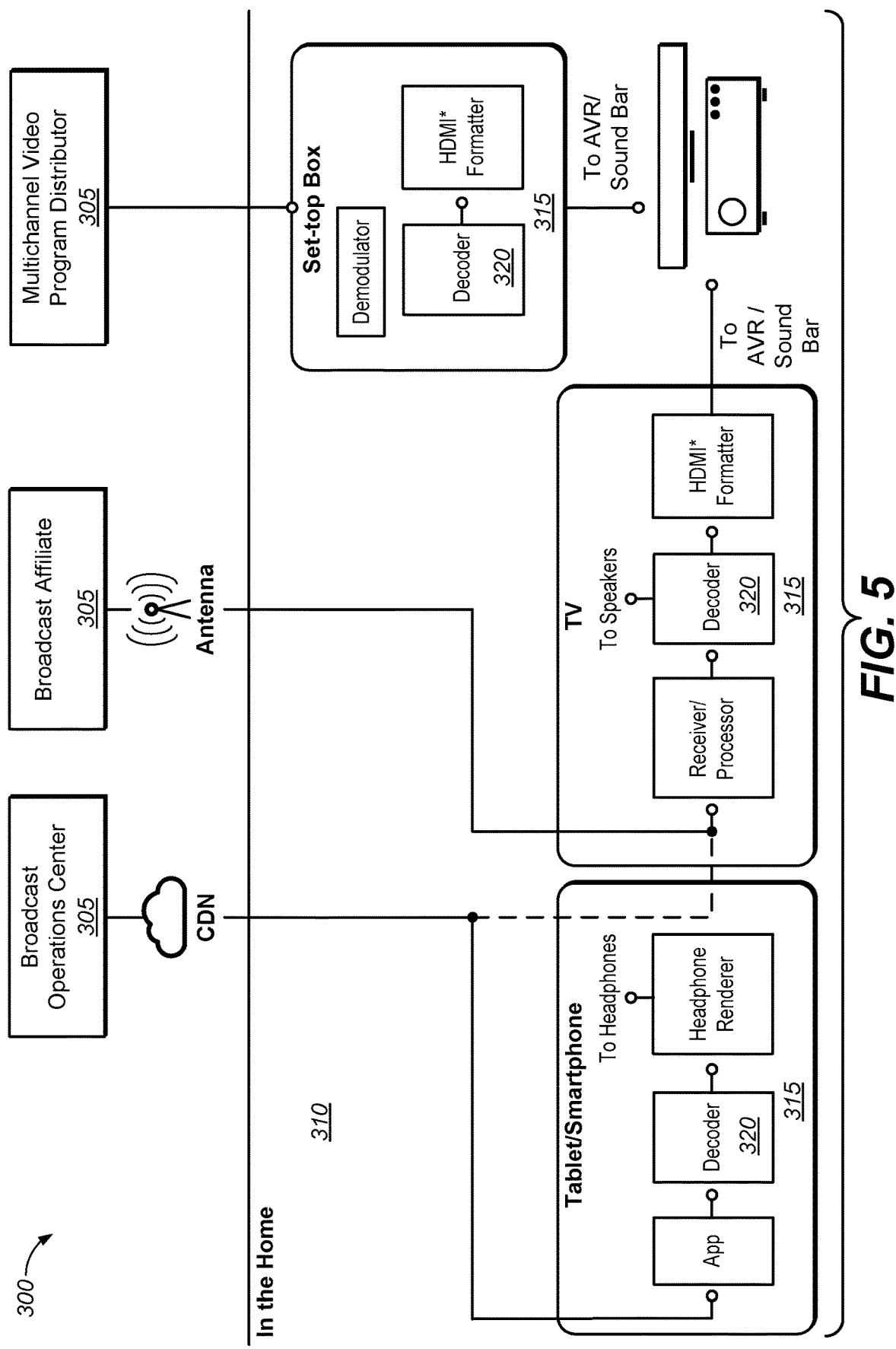
FIG. 5 schematically shows an example signal flow of audio data through an example broadcast ecosystem, including several different systems for delivering the audio data to the home, and several different types of user equipment configured to receive and process the audio data, in accordance with embodiments of the present disclosure.

Referring to FIG. 5, a broadcast ecosystem comprises several different systems for delivering audio data to the home. For example the broadcast ecosystem 300 comprises a broadcast operations center system, a broadcast affiliate system and a multichannel video program distributor.

Within the home, the broadcast ecosystem 300 may comprise several different types of user equipment 315 for receiving and processing the audio data, such as a tablet computer, smartphone or the like; a television; and a set-top box. It may further comprise, within the home, equipment for rendering the audio data, such as an audio video receiver (AVR) and one or more speakers connected to the AVR, or a so-called "sound bar".

As shown in FIG. 5, the user equipment 315, in various embodiments of the present disclosure, comprises a decoder 320. The decoder 320 receives an encoded bit stream comprising the audio data and typically some metadata. The encoded bit stream may be a bit stream generated by an encoding process which complies with a published standard such as "*Digital Audio Compression Standard (AC-3, E-AC-3)," Revision B, Document A/52B*, 14 Jun. 2005 published by the Advanced Television Systems Committee, Inc. (referred to herein as the "ATSC Standard"), and in *ISO/IEC 13818-7, Advanced Audio Coding (AAC)* (referred to herein as the "MPEG-2 AAC Standard") and *ISO/IEC 14496-3, subpart 4* (referred to herein as the "MPEG-4 Audio Standard") published by the International Standards Organization (ISO). The encoding and decoding processes that conform to these standards are mentioned only as examples. Principles of the present disclosure may be used with coding systems that conform to other standards as well.

The encoded audio data is divided into a series of frames. Each of the frames may, for example, comprise 1536 samples; in the decoder 320, these frames may be further divided into frames of 256 samples of audio data.

Some of the metadata identifies a dynamic range compression profile that specifies how the dynamic range of the audio data may be compressed when the encoded audio data is decoded. The full dynamic range of the decoded audio data can be retained or it can be compressed by varying degrees at the time of decoding to satisfy the demands of different applications and listening environments. Other metadata identifies some measure of loudness of the encoded audio data such as an average program level or level of dialog in the encoded audio data. This metadata may be used by a decoder to adjust amplitudes of the decoded audio data to achieve a specified loudness or reference reproduction level during playback.

Figure 1:
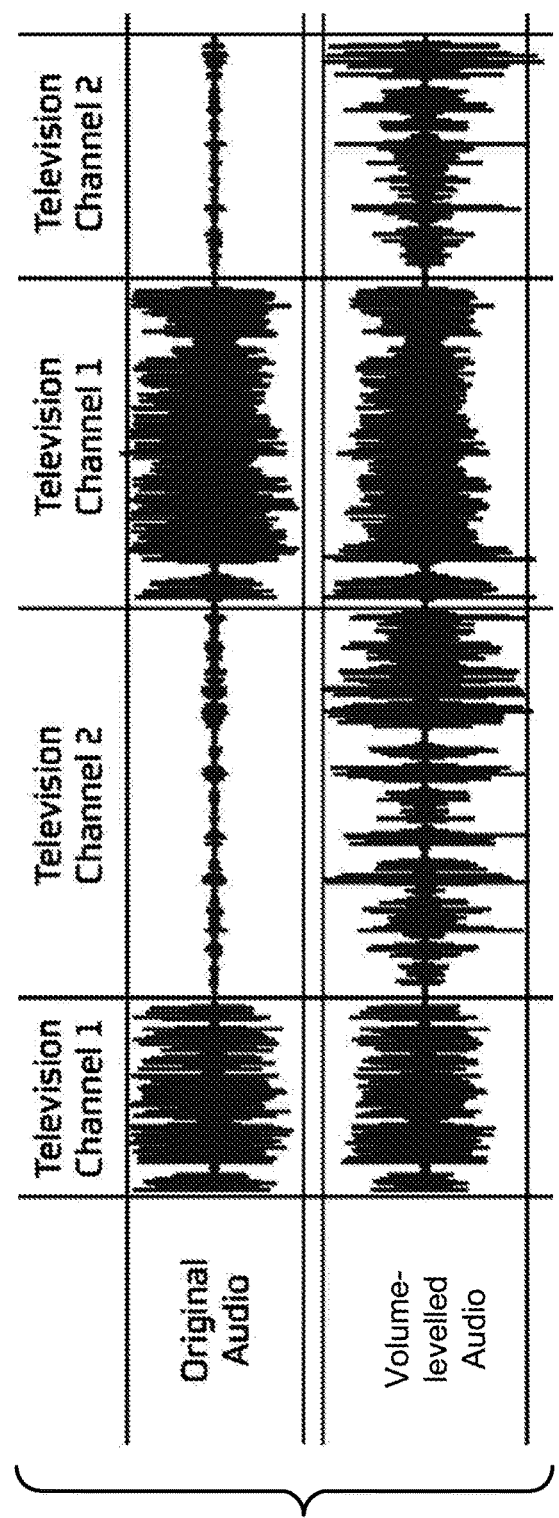
FIG. 1 schematically shows two different audio waveforms, before (top) and after (bottom) VL processing respectively, while switching between two different television channels.
Figure 2:
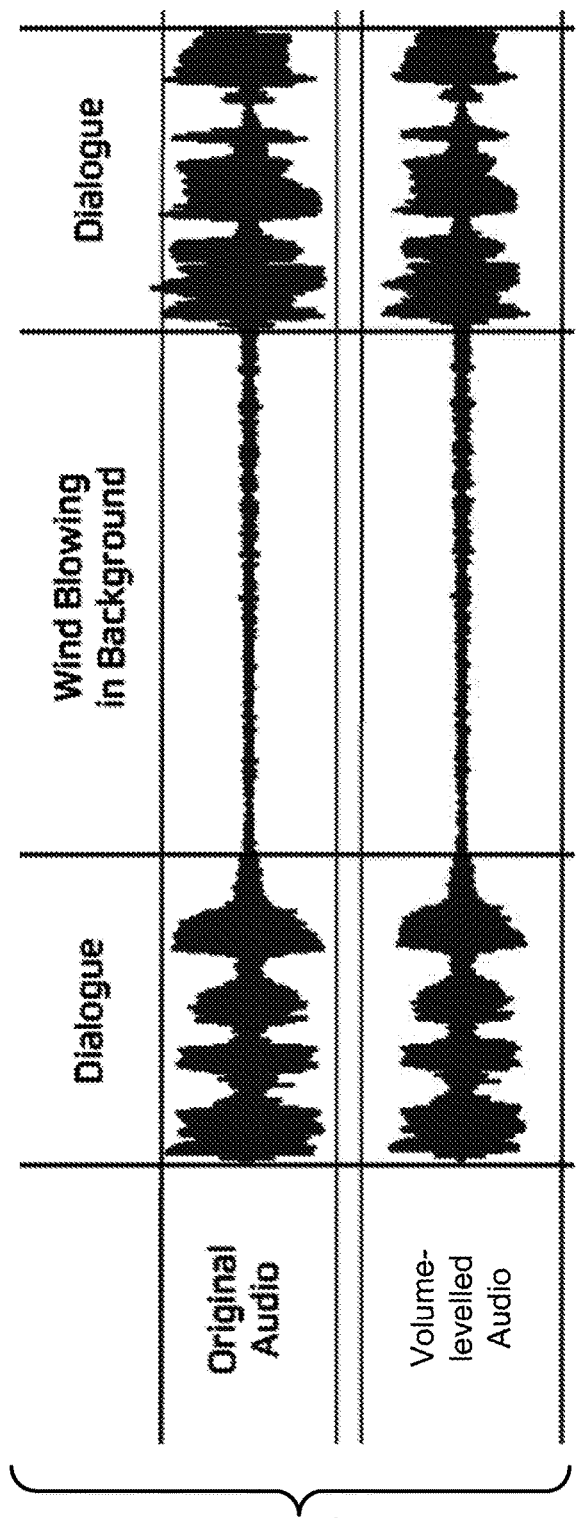
FIG. 2 schematically shows respective audio waveforms, before (top) and after (bottom) VL processing respectively, of two different audio objects from the same audio program.
Figure 3:
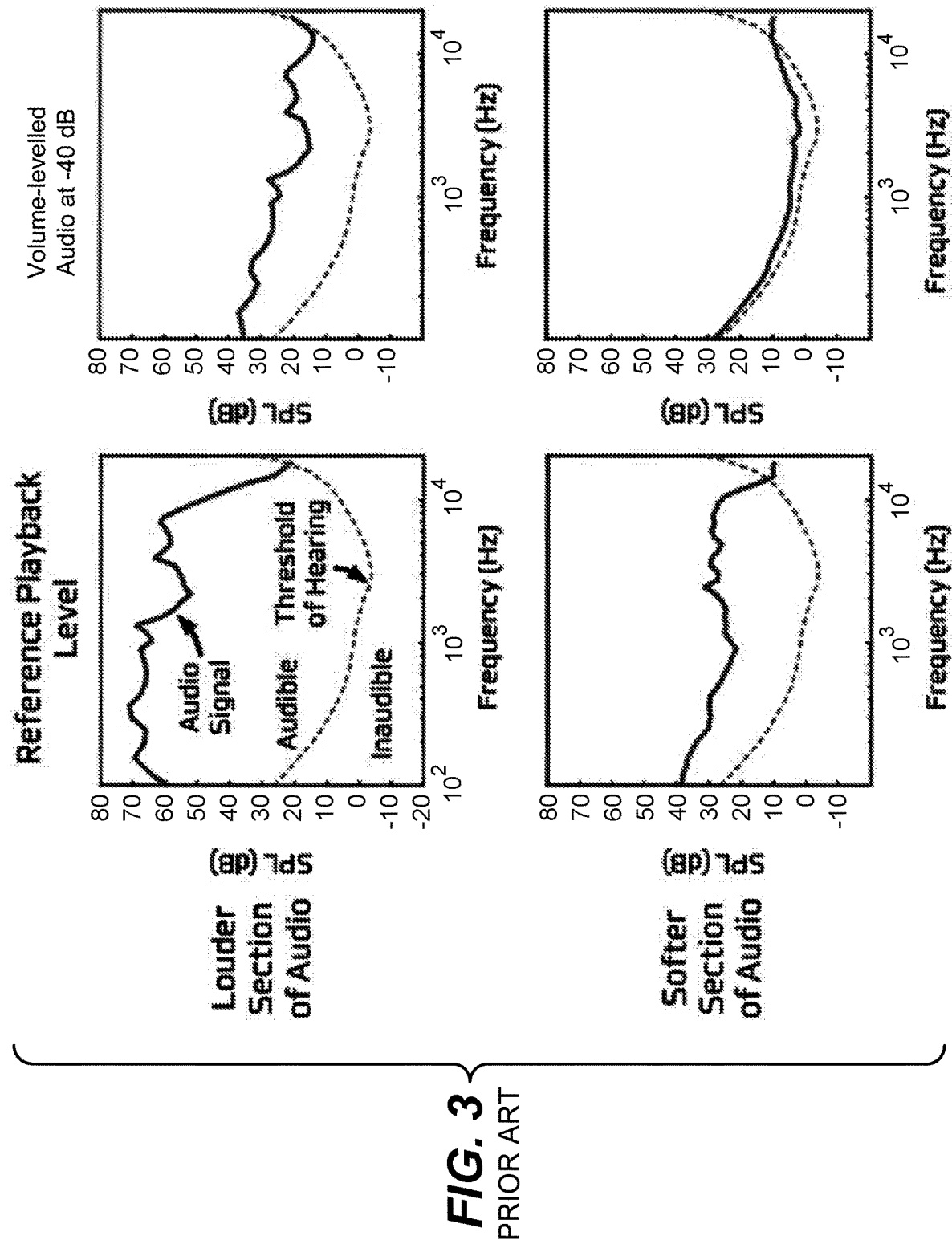
FIG. 3 schematically shows different plots, two before (left-hand side) and two after (right hand side) VL processing respectively, of sound pressure level versus frequency for a "louder" section of audio (top row) and a "softer" section of audio (bottom row).
Figure 4:
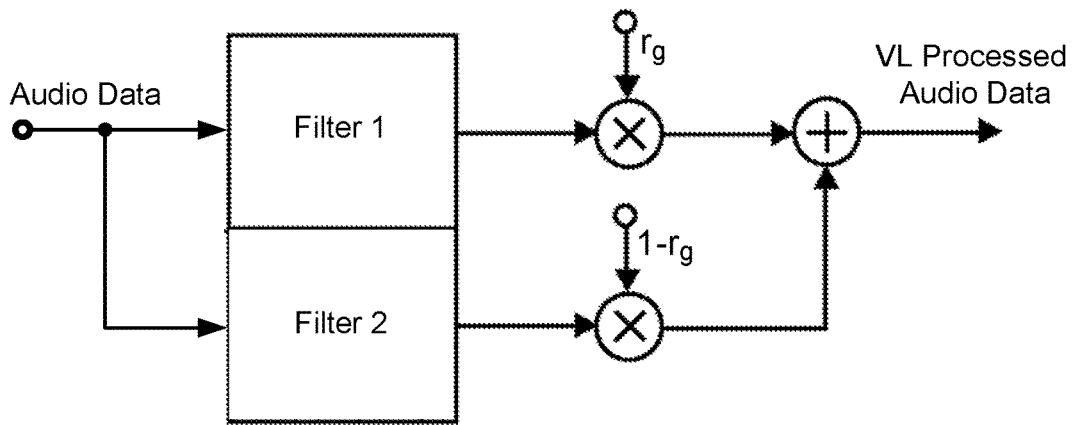
FIG. 4 schematically shows a known arrangement for adapting filter coefficients, used in VL processing, wherein two filters are run in parallel and a cross-fader selects between their respective outputs.
Figure 6:
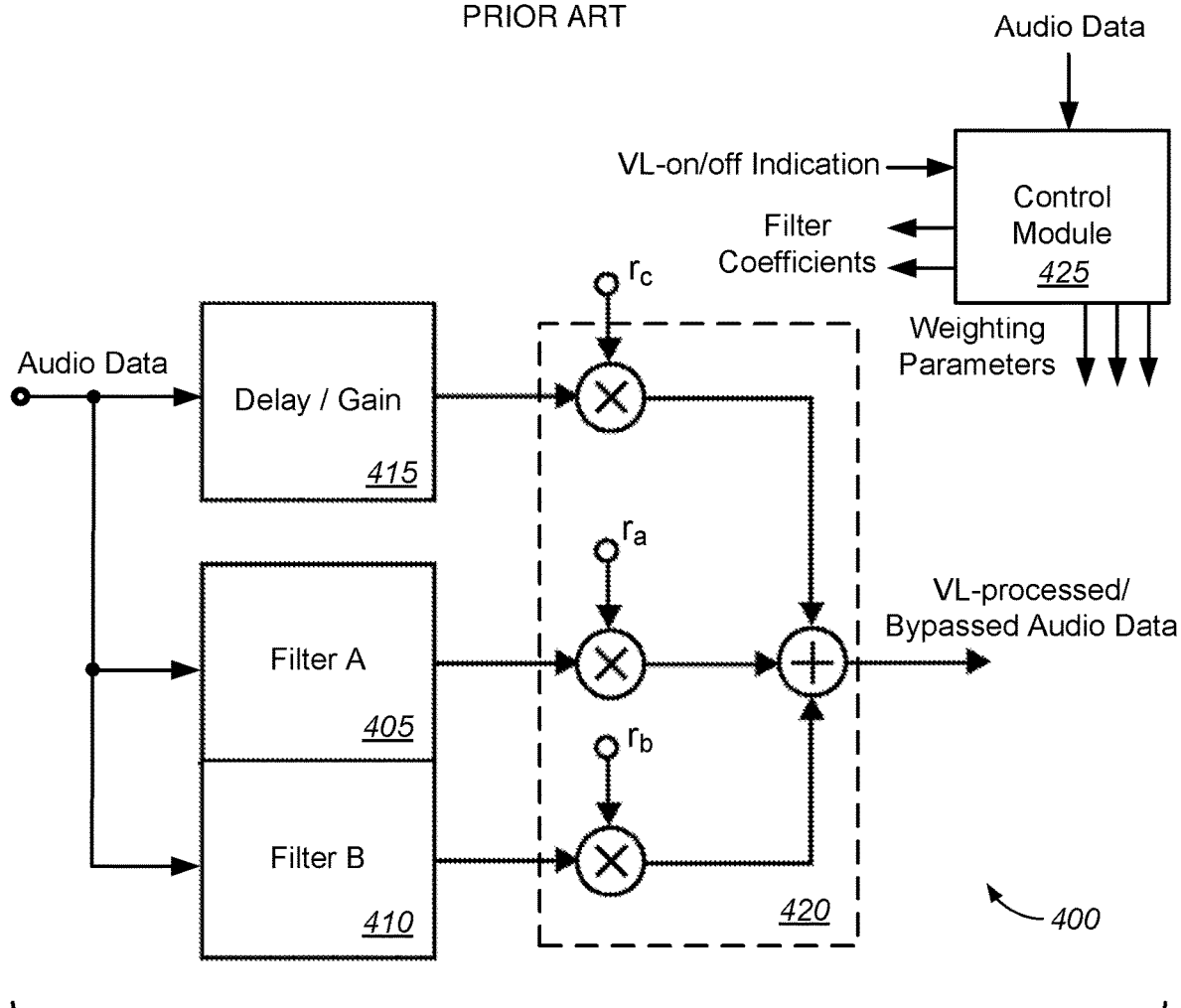
FIG. 6 schematically shows a novel arrangement in accordance with embodiments of the present disclosure, suitable for implementation in one, some or all of the different types of user equipment shown in FIG. 5, wherein two filters and a "delay/gain" module are run in parallel, and a "weight-and-sum" module combines their respective outputs under the control of a novel control module.

The decoder 320 comprises a novel arrangement 400 for applying VL processing, shown in FIG. 6. The novel arrangement 400 comprises a first filter 405, a second filter 410 a delay/gain module 415, a weight-and-sum module 420 and a control module 425.

The first filter 405, the second filter 410 and the delay/gain module 415 are each configured to receive the audio data. That is, each operates on the same audio data. For example, each may receive the audio data from a common buffer. The first filter 405 and the second filter 410 receive respective sets of filter coefficients (not shown in FIG. 6), at run-time, from the control module 425. The delay/gain module 415 applies a substantially frequency-independent gain to the audio data. Since the filtering operations may introduce some latency, due to their operation and/or to (better) align to other processes, the delay/gain module 415 may be configured to buffer the audio data in order to delay it such that the output of the delay/gain module 415 is properly synchronized with the respective outputs of the first filter 405 and the second filter 410. However, this buffering may be foregone in order to reduce computational complexity at the expense of potentially introducing artefacts into the processed audio data.

The weight-and-sum module 420 is configured to receive the respective outputs of the first filter 405, the second filter 410 and the delay/gain module 415. The weight-and-sum module 420 is configured to apply respective weightings to the outputs of the first filter 405, the second filter 410 and the delay/gain module 415, in accordance with weighting parameters received from the control module 425, and then to sum all three of the weighted outputs. The output of the weight-and-sum module 420, which also is an output of the novel arrangement 400, is a version of the audio data which has received VL processing or simply has received a gain and a delay, as determined by the control module 425.

The control module 425 determines appropriate weighting parameters for the weight-and-sum module 420 and appropriate sets of filter coefficients for the first filter 405 and the second filter 410, in dependence on inter alia an indication to turn-off (or turn-on) VL processing for the audio data; the indication is denoted "VL-on/off indication" in FIG. 6, which label will be used in the description hereinbelow for convenience. There are numerous ways of obtaining the indication. For example, the indication may have been encoded into the metadata accompanying the audio data, or the control module 425 may comprise a sub-module configured to analyze the audio data and determine therefrom, in a known manner, whether or not to turn-on VL processing, and to generate the indication accordingly. The indication may also be derived from the presence or absence of reliable program level metadata for the audio data; for example, the metadata may be "signed" (e.g. using cryptographic techniques) in order to "certify" its reliability.

The determinations performed by the control module 425 will now be described in more detail, with reference to FIGS. 7 and 8, which show details of the control module 425.

Figure 7:
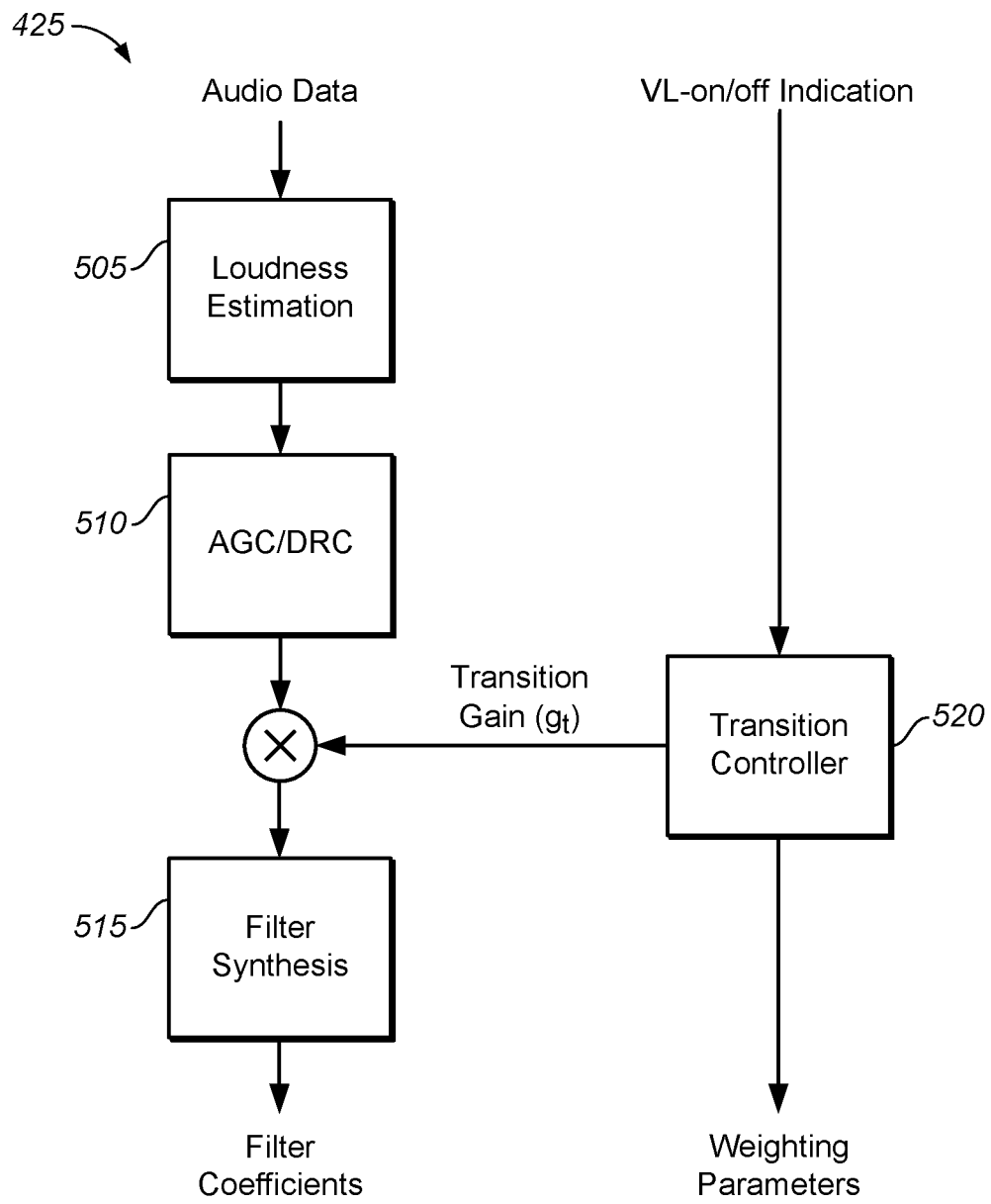
FIG. 7 schematically shows some of the components of the control module shown in FIG. 6, including transition controller module.

As shown in FIG. 7, the control module 425 comprises a loudness estimation module 505, an AGC/DRC module 510, a filter synthesis module 515 and a transition controller module 520.

The loudness estimation module 505 is configured to receive the audio data and analyze it in order to obtain an estimated loudness level associated therewith. Typically the analysis will involve transforming the audio data into the frequency domain and estimating the respective signal power levels in the resulting different frequency bands. Alternatively, for example, the analysis may use or be based on the methods recommended in Recommendation ITU-R BS.1770-3 (August 2012), "Algorithms to measure audio programme loudness and true-peak audio level". The specific manner in which the analysis is performed is not essential; various suitable methods will be apparent to the skilled person without inventive effort. For example, a suitable loudness estimation module is included in Dolby® Volume; see e.g. patent publication number WO 2007/120453 A1 and related patent publications.

The AGC/DRC module 510 is configured to receive the estimated loudness level associated with the audio data, generated by the loudness estimation module 505. The AGC/DRC module 510 is configured to obtain an automatic gain control (AGC) level and a dynamic range control (DRC) level, which combined provide a predetermined target loudness level. The AGC/DRC module 510 is further configured to determine a difference between the estimated loudness level (generated by the loudness estimation module 505) and the predetermined target loudness level, and to generate and output a value indicative of the difference. The specific manner in which the AGC, DRC and predetermined target loudness levels are obtained/determined is not essential; various suitable methods will be apparent to the skilled person without inventive effort. For example, a suitable AGC/DRC module is included in Dolby® Volume; see e.g. patent publication number WO 2007/120453 A1 and related patent publications.

The filter synthesis module 515 is configured to receive an indication of the difference between the predetermined target loudness level and the estimated loudness level associated with the audio data; the indication is a weighted version of the value output by the AGC/DRC module 510, the weighting being determined by the transition controller module 520, as will be described below. The filter synthesis module 515 is further configured to generate a set of filter coefficients, for the first filter 405 or the second filter 410, suitable for reducing, when used to filter the audio data, the difference between the predetermined target loudness level and the estimated loudness level associated with the audio data. The generation of the set of filter coefficients may use or be based on equal loudness level contours such as those specified in the published standard *ISO 226:2003, Acoustics—Normal equal-loudness-level contours*, e.g. it may use polynomials which approximate such equal loudness level contours. In various embodiments, the filter synthesis module 515 is configured to generate the set of filter coefficients in dependence also on a frequency-independent level shift input, so as to effect a "bulk gain" in the processed audio data, including by weighting the frequency-independent level shift in a manner which matches the weighting applied to the value output by the AGC/DRC module 510. The two weightings may be exactly the same, i.e. the same signal may be used to determine the weightings; or different signals may be used to determine the weightings, one of the signals being a scaled and/or delayed version of the other signal, as appropriate. The specific manner in which the set of filter coefficients is generated is not essential; various suitable methods will be apparent to the skilled person without inventive effort. For example, a suitable filter synthesis module is included in Dolby® Volume; see e.g. patent publication number WO 2007/120453 A1 and related patent publications.

The transition controller module 520 is configured to receive the VL-on/off indication for the audio data. In dependence on the VL-on/off indication, the transition controller module 520 is configured to generate and output signals suitable for weighting the value determined by the AGC/DRC module 510, for adapting the first filter 405 and the second filter 410 in accordance with the set of filter coefficients generated by the filter synthesis module 515, and for controlling the weight-and-sum module 420. This will be described in more detail below with reference to FIG. 8.

Figure 8:
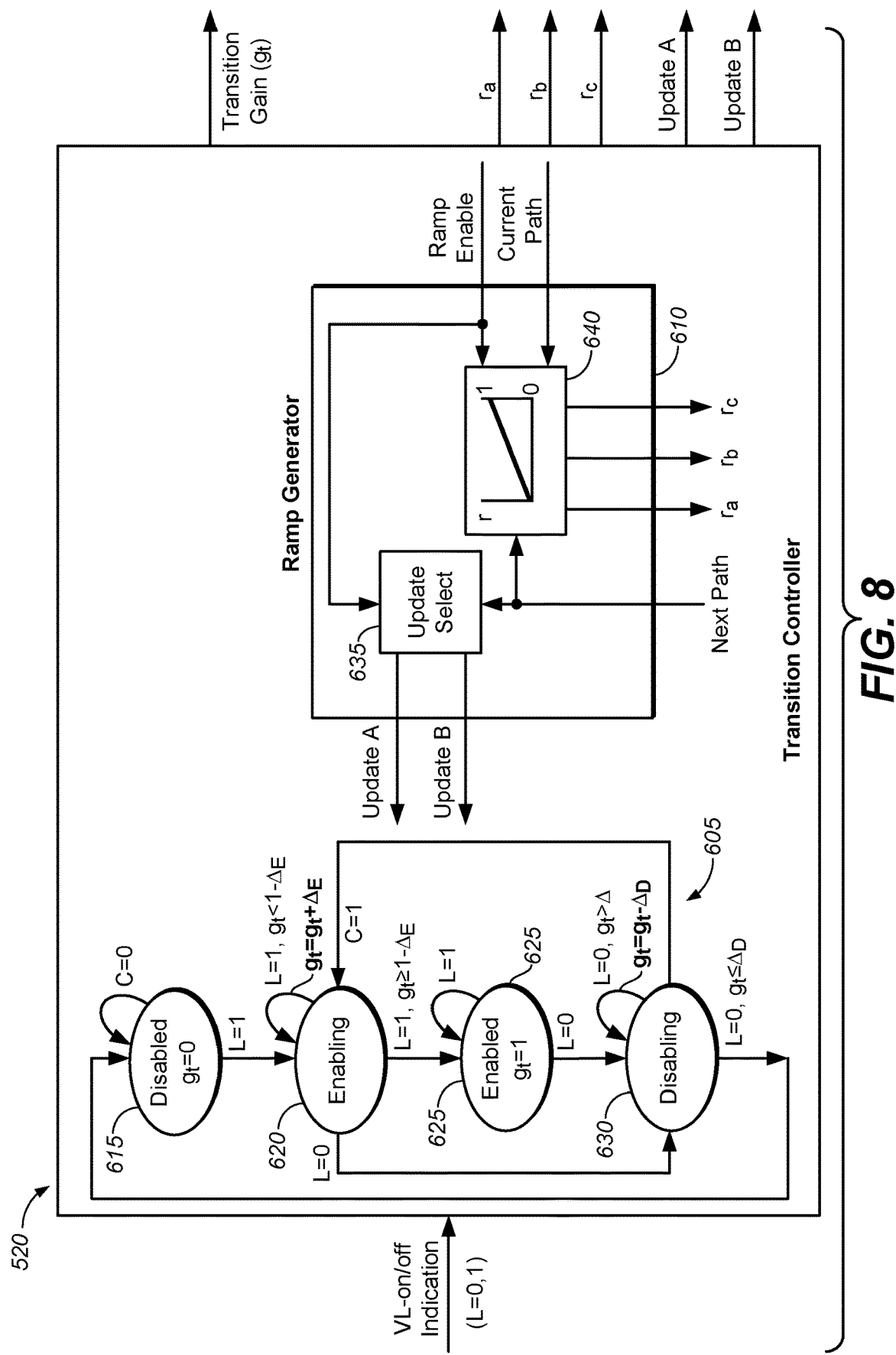
FIG. 8 schematically shows some of the components of the transition controller module shown in FIG. 7.

As shown in FIG. 8, the transition controller module 520 comprises a state machine 605 which functions in cooperation with a ramp generator module 610. In overview, the state machine 605 generates and outputs control signals used by the ramp generator module 610 and a transition gain signal for weighting the value determined by the AGC/DRC module 510; and, in dependence on the control signals received from the state machine 605, the ramp generator module 610 generates and outputs control signals suitable for adapting the first filter 405 and the second filter 410 in accordance with the set of filter coefficients generated by the filter synthesis module 515, and the weighting parameters for the weight-and-sum module 420.

Turning first to the state machine 605, FIG. 8 shows that the state machine 605 has four main states: a disabled state 615; an enabling state 620; an enabled state 625; and a disabling state 630. The respective transitions from each of the four main states 615, 620, 625, 630 are determined at least in part by the current value of the VL-on/off indication for the audio data. The respective transitions from the enabling state 620 and the disabling state 630 are determined also by the current value of the transition gain signal.

The state machine 605 transitions between its main states as follows. The state machine 605 remains in the disabled state 615 until the VL-on/off indication indicates to turn-on VL processing for the audio data, which causes the state machine 605 to transition to the enabling state 620. The state machine 605 then remains in the enabling state 620 until the transition gain signal (which increases in increments, $\Delta_E$) reaches a first predetermined threshold $(1-\Delta_E)$, which causes the state machine 605 to transition to the enabled state 625. Note that the size of the increment $\Delta_E$ determines how long it takes for the transition gain signal to reach the first predetermined threshold. The state machine 605 then remains in the enabled state 625 until the VL-on/off indication indicates to turn-off VL processing for the audio data, which causes the state machine 605 to transition to the disabling state 630. The state machine 605 then remains in the disabling state 630 until the transition gain (which decreases in decrements, $\Delta_D$) reaches or falls below a second predetermined threshold $(\Delta_D)$, which causes the state machine 605 to transition to the disabled state 615. Note that the size of the decrement $\Delta_D$ determines how long it takes for the transition gain signal to reach or fall below the second predetermined threshold.

The state machine 605 has three main outputs: a ramp enable signal and a path select signal, both of which are received by the ramp generator 610; and the transition gain signal. The three main outputs are determined inter alia by the current state of the state machine 605. When the state machine 605 is in the disabled state 615, the ramp enable signal is set to "disable" and the path select signal is set to "path C". When the state machine 605 is in the enabling state 620, the transition gain increases steadily from 0 towards 1, the ramp enable signal is set to "enable" and the path select signal periodically alternates between "path A" and "path B" (one a per-frame basis, e.g. "path A" for one frame of the audio data and then "path B" for the following frame of the audio data). When the state machine 605 is in the enabled state 625, the transition gain is set to 1, the ramp enable signal is set to "enable" and the path select signal periodically alternates (again on a per-frame basis) between "path A" and "path B". When the state machine 605 is in the disabling state 630, the transition gain decreases steadily towards 0, the ramp enable signal is set to "enable" and the path select signal periodically alternates between "path A" and "path B".

The steady increase/decrease of the transition gain is responsible for a gradual increase/decrease in the weighting of the value determined by the AGC/DRC module 510, i.e. the value indicative of an estimated difference between a target output loudness level and a loudness level associated with the input audio data. The steady increase/decrease occurs over the course of a first predetermined time period, which preferably is not more than 500 milliseconds and not less than 50 milliseconds, and more preferably is not less than 150 milliseconds and not more than 250 milliseconds. For example, the steady increase/decrease may occur over approximately 20 frames of the audio data. The steady increase and the steady decrease may occur over respective different time periods; for example, the steady decrease may occur over a time period which is half that of the steady increase.

In various embodiments, the path select signal may comprise two or more sub-signals. For example, and as shown in FIG. 8, the path select signal may comprise a current path signal and a next path signal. In embodiments comprising a current path signal and a next path signal, the state machine 605 may determine respective values for these signals as follows.

For a transition from the disabled state 615 to the disabled state 615:
  CurrentPath=NextPath=path C
For a transition from the disabling state 630 to the disabled state 615:
  CurrentPath=NextPath
  NextPath=path C
For a transition from the disabled state 615 to the enabling state 620:
  CurrentPath=path C
  NextPath=path A
For all other state transitions:
  CurrentPath=NextPath
  If CurrentPath==A, NextPath=path B
  Else NextPath=path A Turning now to the ramp generator module 610, FIG. 8 shows that the ramp generator module 610 comprises an update select module 635 and a weighting generation module 640.

The weighting generation module 640 receives the ramp enable signal and the path select signal from the state machine 605. Based on those two signals, the weighting generation module 640 generates the weighting parameters for the weight-and-sum module 420. The weighting parameters are suitable for cross fading between the respective outputs of the first filter 405 and the second filter 410 when the state machine 605 is in its enabling state 620 or its enabled state 625, for cross fading from the respective output of one of the filters 405, 410 to the output of the delay/gain module 415 when the state machine 605 transitions from its disabling state 632 to its disabled state 615, and for cross fading from the output of the delay/gain module 415 to the respective output of one of the filters 405, 410 when the state machine 605 transitions from its disabled state 615 to its enabling state 620.

Each said cross fading preferably commences at a boundary between adjacent frames of the audio data and ends at the next boundary between adjacent frames of the audio data. The cross fading from the respective output of one of the filters 405, 410 to the output of the delay/gain module 415, and the cross fading from the output of the delay/gain module 415 to the respective output of one of the filters 405, 410, preferably commences when the transition gain signal reaches 0 or 1, respectively; however, it could commence within a predetermined time period centered on the transition gain signal reaches 0/1, e.g. a 50 millisecond time period.

The update select module 635 receives the ramp enable signal and (at least part of) the path select signal from the state machine 605. Based on those two signals, the update select module 635 generates and outputs a respective update enable signal for each of the first filter 405 and the second filter 410. The first and second filters 405, 410 are configured to adapt to the respective sets of filter parameters that they receive from the filter synthesis module 415 in response to their respective update enable signals being set to "enable". Adapted in this manner, the first filter 405 or the second filter 410 (whichever is "enabled") is configured to reduce, by filtering the audio data, the difference between the predetermined target loudness level and the estimated loudness level associated with the audio data. It will be appreciated that the ramp enable signals are synchronized with the weighting parameters such that the cross fading is suitably synchronized with the filter updates.

Accordingly, and as shown in FIG. 9, the novel arrangement 400 is configured to perform a method 700 of starting/stopping volume-levelling processing on the audio data, in response obtaining 705 an indication to start/stop the volume-levelling processing, by at least increasing/decreasing 710 a weighting applied to an estimated difference between a target output loudness level (e.g., in the embodiment described above, the predetermined target loudness level generated by the AGC/DRC module 510) and a loudness level associated with the input audio data (e.g., in the embodiment described above, the estimated loudness level generated by the loudness estimation module 505).

In various embodiments, the techniques described herein are implemented by one or more special-purpose computing devices. In at least one embodiment, one or more such special-purpose computing devices may be connected together and/or to other computing devices.

FIG. 10 is a block diagram that shows examples of components of such a special-purpose computing device 800. In this example, the computing device 800 includes an interface system 805. The interface system 805 may include a network interface, such as a wireless network interface. Alternatively, or additionally, the interface system 805 may include a universal serial bus (USB) interface or another such interface.

The device 800 includes a logic system 810. The logic system 810 may include a processor, such as a general purpose single- or multi-chip processor. The logic system 810 may include a digital signal processor (DSP), an application specific integrated circuit (ASIC), a field programmable gate array (FPGA) or other programmable logic device, discrete gate or transistor logic, or discrete hardware components, or combinations thereof. The logic system 810 may be configured to control the other components of the device 800. Although no interfaces between the components of the device 800 are shown in FIG. 10, the logic system 810 may be configured with interfaces for communication with the other components. The other components may or may not be configured for communication with one another, as appropriate.

The logic system 810 may be configured to perform audio processing functionality, including but not limited to the techniques described herein. In some such implementations, the logic system 810 may be configured to operate (at least in part) according to software stored one or more non-transitory media. The non-transitory media may include memory associated with the logic system 810, such as random access memory (RAM) and/or read-only memory (ROM). The non-transitory media may include memory of the memory system 815. The memory system 815 may include one or more suitable types of non-transitory storage media, such as flash memory, a hard drive, etc.

The display system 830 may include one or more suitable types of display, depending on the manifestation of the device 800. For example, the display system 830 may include a liquid crystal display, a plasma display, a bistable display, etc.

The user input system 835 may include one or more devices configured to accept input from a user. In some implementations, the user input system 835 may include a touch screen that overlays a display of the display system 830. The user input system 835 may include a mouse, a track ball, a gesture detection system, a joystick, one or more GUIs and/or menus presented on the display system 830, buttons, a keyboard, switches, etc. In some implementations, the user input system 835 may include the microphone 825: a user may provide voice commands for the device 800 via the microphone 825. The logic system may be configured for speech recognition and for controlling at least some operations of the device 800 according to such voice commands.

The power system 840 may include one or more suitable energy storage devices, such as a nickel-cadmium battery or a lithium-ion battery. The power system 840 may be configured to receive power from an electrical outlet.

Even though the present disclosure describes and depicts specific example embodiments, the invention is not restricted to these specific examples. Modifications and variations to the above example embodiments can be made without departing from the scope of the invention, which is defined by the accompanying claims only. For example, the filter adaptation and cross fading between respective filter outputs has been described as occurring on a per-frame basis during the gradual increase/decrease of the transition gain signal; however, trading reduced signal fidelity against improved computational efficiency, the filter adaptation and cross fading could be done less frequently. As another example, a similar but different filter synthesis module could be used, such as a filter synthesis module which is independent of the audio data.

In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs appearing in the claims are not to be understood as limiting their scope.

Note that, although separate embodiments, architectures and implementations are discussed herein, any suitable combination of them (or of parts of them) may form further embodiments, architectures and implementations.

What is claimed is:

1. A method of operating a computing device configured to perform volume-levelling processing on input audio data by at least applying one or more filters to the input audio data, the computing device being configured to obtain a value indicative of the difference between a target output loudness level and an estimated loudness level of the input audio data, and to adapt the filter coefficients of the one or more filters based on a weighted version of the obtained value, the method controlling the computing device to start, or stop, the volume-levelling processing, the method comprising:
   gradually increasing, or decreasing, the weighting of the weighted version of the obtained value, in response to obtaining an indication to start, or stop, the volume-levelling processing,
   wherein starting the volume-levelling processing comprises cross-fading from i) an output of a module configured to apply a substantially frequency-independent gain and a delay to the input audio data to ii) an output of the one or more filters,
   wherein stopping the volume-levelling processing comprises cross-fading from i) the output of the one or more filters to ii) the output of the module configured to apply the substantially frequency-independent gain and the delay to the input audio data,
   wherein adapting the filter coefficients of the one or more filters also takes account of a frequency-independent level shift input, the method further comprising applying a weighting to the frequency-independent level shift input which is matched to the weighting of the weighted version of the obtained value.

2. The method of claim 1, comprising increasing the weighting from a lower limit to an upper limit, or decreasing the weighting from the upper limit to the lower limit, over the course of a first predetermined time period.

3. The method of claim 2, wherein the first predetermined time period is not more than 500 milliseconds.

4. The method of claim 2, wherein the first predetermined time period is not less than 50 milliseconds.

5. The method of claim 2, wherein the first predetermined time period is not less than 150 milliseconds and not more than 250 milliseconds.

6. The method of claim 2, wherein the cross-fading begins during a second predetermined time period centered on expiry, or commencement, of the first predetermined time period.

7. The method of claim 6, wherein the second predetermined time period is not more than 50 milliseconds.

8. The method of claim 1, wherein the input audio data comprises a sequence of frames of audio data.

9. The method of claim 1, wherein the one or more filters comprises two filters applied to the input audio data at the same time, and wherein adapting the filter coefficients of the one or more filters comprises alternately updating respective sets of filter coefficients of the two filters.

10. The method of claim 9, wherein the input audio data comprises a sequence of frames of audio data and the respective sets of filter coefficients are alternately updated on a per-frame basis.

11. The method of claim 9, further comprising alternately cross-fading between the respective audio data outputs of the two filters.

12. The method of claim 9, wherein the input audio data comprises a sequence of frames of audio data and the cross fading between the respective audio outputs of the two filters is done alternately and on a per-frame basis.

13. A non-transitory medium comprising software which, when executed by a logic system of a computing device, causes the computing device to perform the method of claim 1.

14. The method of claim 1, wherein the delay buffers the input audio data.

15. The method of claim 1, wherein the delay synchronizes the output of the one or more filters and the output of the module configured to apply the substantially frequency-independent gain and the delay.

16. A computing device configured to perform volume-levelling processing on input audio data by at least applying one or more filters to the input audio data, the computing device being configured to obtain a value indicative of the difference between a target output loudness level and an estimated loudness level of the input audio data, and to adapt the filter coefficients of the one or more filters based on a weighted version of the obtained value, the computing device being further configured to perform a method controlling the computing device to start, or stop, the volume-levelling processing, the method comprising:
   gradually increasing, or decreasing, the weighting of the weighted version of the obtained value, in response to obtaining an indication to start, or stop, the volume-levelling processing,
   wherein starting the volume-levelling processing comprises cross-fading from i) an output of a module configured to apply a substantially frequency-independent gain and a delay to the input audio data to ii) an output of the one or more filters,
   wherein stopping the volume-levelling processing comprises cross-fading from i) the output of the one or more filters to ii) the output of the module configured to apply the substantially frequency-independent gain and the delay to the input audio data,
   wherein adapting the filter coefficients of the one or more filters also takes account of a frequency-independent level shift input, the method further comprising applying a weighting to the frequency-independent level shift input which is matched to the weighting of the weighted version of the obtained value.

17. The computing device of claim 16, wherein the method further comprises increasing the weighting from a lower limit to an upper limit, or decreasing the weighting from the upper limit to the lower limit, over the course of a first predetermined time period.

18. The computing device of claim 17, wherein the first predetermined time period is not more than 500 milliseconds.

19. The computing device of claim 17, wherein the first predetermined time period is not less than 50 milliseconds.

20. The computing device of claim 17, wherein the cross-fading begins during a second predetermined time period centered on expiry, or commencement, of the first predetermined time period.

* * * * *